United States Patent [19]

Street

[11] Patent Number: 4,538,346
[45] Date of Patent: Sep. 3, 1985

[54] METHOD FOR MANUFACTURE OF SELECTIVELY COATED CARRIER PLATE

[75] Inventor: William D. Street, Sahuarita, Ariz.

[73] Assignee: SFE Technologies, Inc., San Fernando, Calif.

[21] Appl. No.: 614,720

[22] Filed: May 29, 1984

Related U.S. Application Data

[63] Continuation of Ser. No. 301,648, Sep. 14, 1981, abandoned.

[51] Int. Cl.³ .............................................. H01F 41/00
[52] U.S. Cl. .................................... 29/602 R; 29/840; 29/841; 29/846; 336/65; 336/192; 336/200; 361/395; 361/403; 361/408; 361/409; 427/96; 427/284
[58] Field of Search ...................... 29/602 R, 840, 841, 29/846; 361/395, 409, 410, 396, 412, 403, 408; 174/68.5; 427/96, 99, 300, 284; 336/85, 192, 200

[56] References Cited

U.S. PATENT DOCUMENTS

| | | | |
|---|---|---|---|
| 2,000,226 | 5/1935 | Fry | 427/284 |
| 3,483,308 | 12/1969 | Wakeley | 361/403 X |
| 3,590,480 | 7/1971 | Johnson, Jr. et al. | 29/602 R X |
| 3,697,817 | 10/1972 | Yongue | 361/395 |
| 3,824,518 | 7/1974 | Slenker | 29/602 R X |
| 4,366,342 | 12/1982 | Breedlove | 361/403 X |

*Primary Examiner*—Carl E. Hall
*Attorney, Agent, or Firm*—Christie, Parker & Hale

[57] ABSTRACT

A plurality of insulated carrier plates are selectively coated with an electrical conductor. Each plate has a pair of flat mounting faces and a plurality of edge faces between the mounting faces. The edge faces include a plurality of spaced-apart, flat, coplanar protrusions projecting from the remainder of the edge faces. One of the mounting faces of each plate is coated with a plurality of mutually isolated first conductive layers, which extend to the respective protrusions. The other mounting face of each plate is coated with a plurality of mutually isolated second conductive layers, which extend to the respective protrusions. The plates are stacked face-to-face so the respective protrusions of adjacent plates adjoin. A conductive layer is then applied to the adjoining protrusions of the stacked plates to the exclusion of the remainder of the edge faces so as to interconnect electrically the respective first and second conductive layers. A transformer is mounted on one mounting face and connected to the respective conductive layers thereon. The transformer and the adjacent mounting face are encapsulated in an insulative material.

11 Claims, 7 Drawing Figures

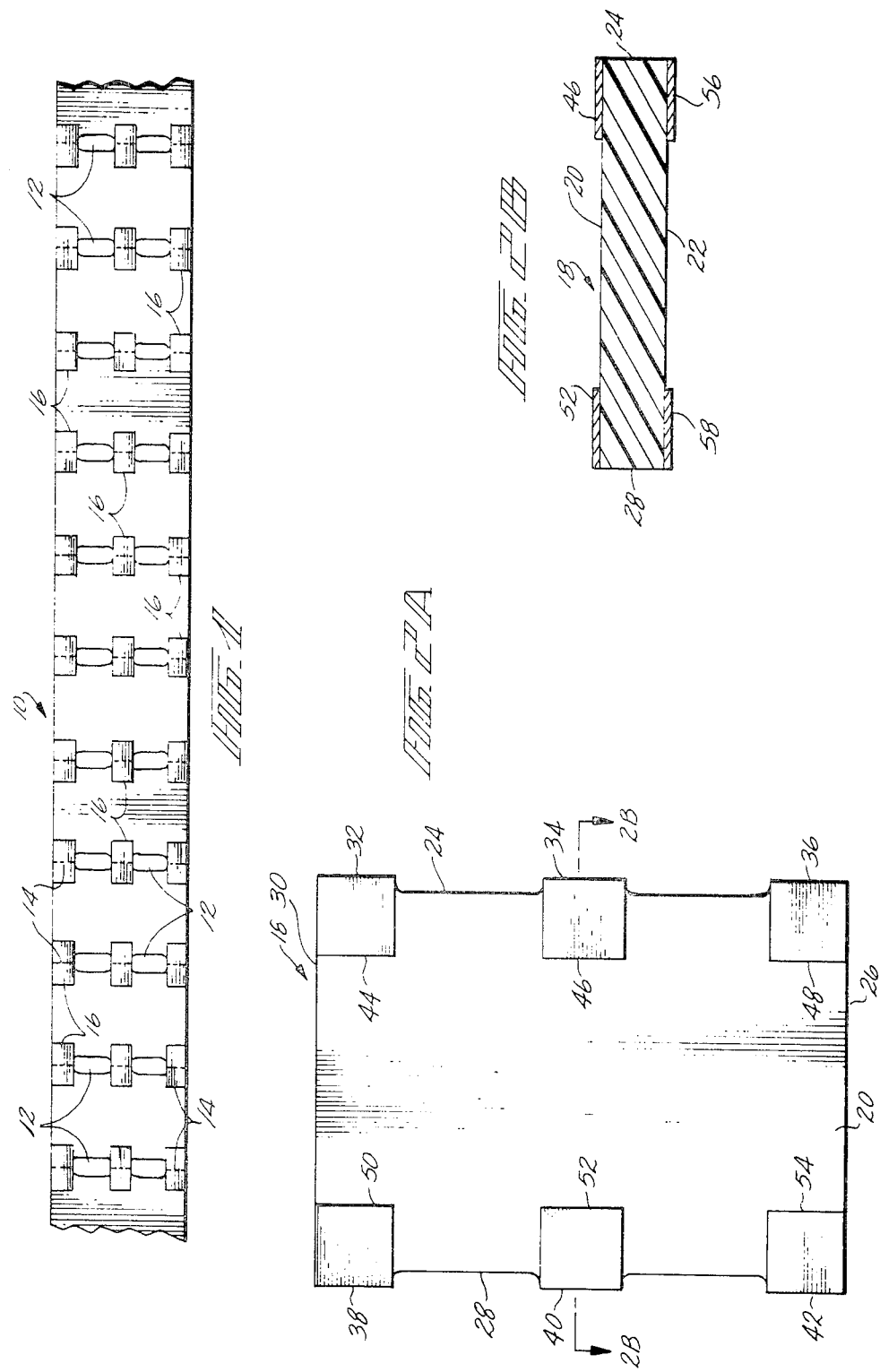

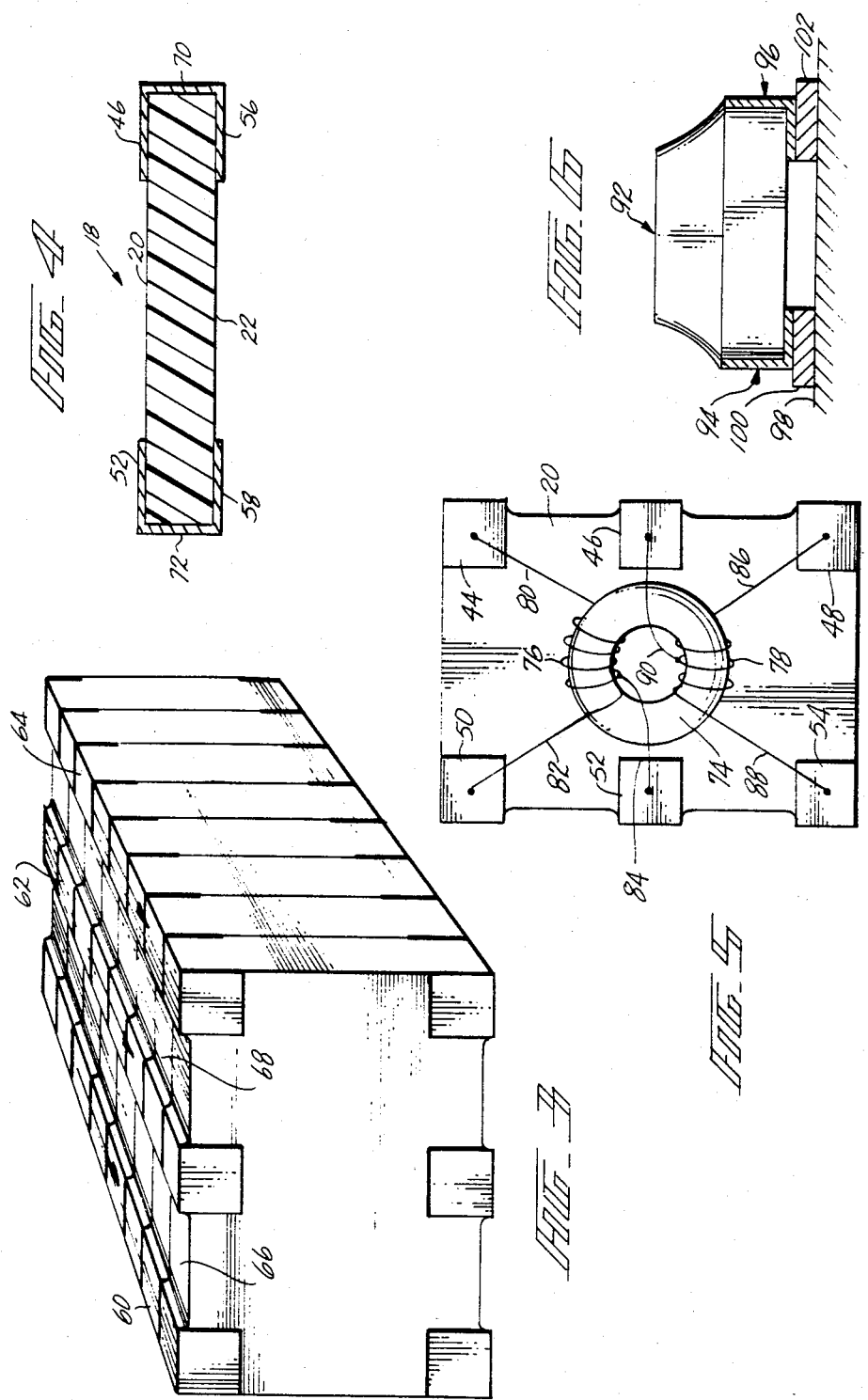

METHOD FOR MANUFACTURE OF SELECTIVELY COATED CARRIER PLATE

This is a continuation of application Ser. No. 201,648, filed Sept. 14, 1981, now abandoned.

BACKGROUND OF THE INVENTION

This invention relates to the manufacture of electrical circuit components adapted to be connected to hybrid circuitry or other flat conductive circuits and, more particularly, to a selectively-coated carrier plate for a miniature transformer and a method of manufacturing same.

Electrical components adapted to be connected to hybrid circuitry are typically mounted on one face of a carrier plate that has wraparound terminal pads leading from the component to the other face of the carrier plate, where the component is electrically connected to flat conductors of a hybrid circuit or the like by solder reflow or a conductive epoxy laydown or the like.

In the case of an inductor, which has only two leads, the fabrication of two appropriate wraparound terminal pads for these leads is a relatively simple matter. Using an electrically conductive paste, conductive strips are formed along opposite sides of each mounting face of a thin rectangular carrier plate by silk screening techniques. After baking the strips, a plurality of these carrier plates are stacked face-to-face so one edge face of each plate between strips adjoins the next. After working a conductive paste into a thin uniform layer on a roller, the layer is transferred to the adjoining edge faces of the plates to electrically interconnect the strips on opposite faces and thereby complete one wraparound terminal pad on all the stacked plates. The other wraparound terminal pad on all the stacked plates is formed in the same way.

In the case of a transformer, which has four, six, or even more leads, wraparound terminal pads cannot be formed by stacking the carrier plates in the same manner as inductors, described above. However, the formation of four or more mutually isolated conductive layers on the edge faces between mounting faces of each carrier plate individually would be extremely time consuming and thus costly.

SUMMARY OF THE INVENTION

According to the invention, especially configured insulative carrier plates can be selectively coated with an electrical conductor to form four, six, or more wraparound terminal pads by means of the same operative steps described above in connection with inductors.

One aspect of the invention is a method for selectively coating with an electrical conductor a plurality of insulative carrier plates, each having a pair of flat mounting faces and a plurality of edge faces between the mounting faces. The edge faces include a plurality of spaced-apart flat coplanar protrusions projecting from the remainder of the edge faces. One of the mounting faces of each plate is coated with a plurality of mutually isolated first conductive layers, which extend to the respective protrusions. The other mounting face of each plate is coated with a plurality of mutually isolated second conductive layers extending to the respective protrusions. The plates are then stacked face-to-face so the respective protrusions of adjacent plates adjoin. A conductive layer is finally applied to the adjoining protrusions of the stacked plates to the exclusion of the remainder of the edge faces so as to interconnect electrically the respective first and second conductive layers. By virtue of the protrusions on the carrier plates, the conductive layer can easily be applied to the protrusions of many plates at the same time without application to the remainder of the edge faces therebetween. Thus, the conductive layers formed on the edge faces of a plate are mutually isolated from each other, as required for terminal pads, because no layer is formed between protrusions, and four or more pads can be formed by the described technique.

Another aspect of the invention is a miniature transformer comprising an insulative carrier plate, at least four wraparound terminal pads on the carrier plate, and a transformer secured to the carrier plate. The carrier plate has a pair of flat, mounting faces and a plurality of edge faces between the mounting faces. The edge faces include a first plurality of spaced-apart, flat, coplanar protrusions projecting from the remainder of the edge faces, and a second plurality of spaced-apart, flat, coplanar protrusions projecting from the remainder of the edge faces on the opposite side of the carrier plate from the first plurality of protrusions. One of the wraparound terminal pads comprises a first continuous conductive layer covering a region on the one mounting face, a region on the other mounting face, and one of the first plurality of protrusions. Another wraparound terminal pad comprises a second continuous conductive layer covering a region on one mounting face, a region on the other mounting face, and another of the first plurality of protrusions, such that the first and second layers cover the respective first protrusions to the exclusion of the edge faces between the first plurality of protrusions. Another wraparound terminal pad comprises a third continuous conductive layer covering a region on the one mounting face, a region on the other mounting face, and one of the second plurality of protrusions. Still another wraparound terminal pad comprises a fourth continuous conductive layer covering a region on one mounting face, a region on the other mounting face, and another of the second plurality of protrusions, such that the third and fourth layers cover the respective second protrusions to the exclusion of the edge faces between the second plurality of protrusions. The transformer has first, second, third, and fourth leads connected to the respective first, second, third, and fourth conductive layers on the one mounting face. Preferably, the transformer is secured to the carrier plate by encapsulating it and the one mounting face in an insulative material.

BRIEF DESCRIPTION OF THE DRAWINGS

The features of a specific embodiment of the best mode contemplated of carrying out the invention are illustrated in the drawings, in which:

FIG. 1 is a top plan view of a separable carrier plate assembly;

FIGS. 2A and 2B are top and side sectional views, respectively, of a carrier plate after separation from the assembly of FIG. 1;

FIG. 3 is a perspective view of a plurality of carrier plates similar to that in FIG. 2 stacked face to face;

FIG. 4 is a side sectional view of the carrier plate of FIG. 2 after selective coating of its edge faces with conductive layers;

FIG. 5 is a top plan view of the carrier plate of FIG. 4 on which a transformer is mounted; and FIG. 6 is a side elevation view of the carrier plate of FIG. 5 after encapsulation of the transformer and the adjacent mounting face.

DETAILED DESCRIPTION OF THE SPECIFIC EMBODIMENT

In FIG. 1 is shown a carrier plate assembly 10 made of a thin, generally rectangular sheet of electrically insulative ceramic material, such as 96% alumina, which is a commonly used substrate for electronic components. A plurality of parallel, side-by-side rows of generally rectangular openings 12 with rounded corners are formed in assembly 10 while uncured. The long sides of openings 12 of each row are aligned with each other. By way of example, openings 12 could be formed by punching. After formation of openings 12, the surface of assembly 10 is scored, for example, by a laser or other cutting apparatus, along parallel lines through the middle of openings 12, as represented by score lines 14. Then, assembly 10 is cured by firing it in a high-temperature kiln in well-known fashion. In a typical embodiment, assembly 10 would be 0.200" wide and 0.025" thick, the distance between score lines 14 would be 0.149", there would be 35 score lines producing 36 carrier plates, and openings 12 would be 0.055" long and 0.025" wide; the distance between adjacent openings 12 and openings 12 and the top and bottom edges of assembly 10 would preferably be the same, namely, 0.030".

Next, one side face of assembly 10 is selectively coated with a plurality of mutually isolated conductive layers 16 aligned with the rows of openings 12 and extending between adjacent openings 12 and the top and bottom edges of assembly 10. By way of example, conductive layers 16 could be a hardenable palladium-silver paste of a type which is commercially available in tube form and has about the same viscosity as 50-weight fuel oil. The paste is selectively applied to the one side face of assembly 10 in the pattern shown in FIG. 1 by conventional silk screening techniques. Then, assembly 10 is baked in an oven, typically at a temperature of the order of 300° until conductive layers 16 harden sufficiently to resist smearing on contact. Next, the other side face of assembly 10, not shown in FIG. 1, is similarly coated with a plurality of mutually isolated conductive layers, which are in registration with conductive layers 16, and assembly 10 is again placed in an oven to bake hard enough to resist smearing on contact.

At this point, assembly 10 is separated by bending along score lines 14 until assembly 10 snaps apart, forming a plurality of individual similar carrier plates, such as that designated 18 in FIGS. 2A and 2B. As used herein, the term "similar" means the same within the tolerances specified by the particular application. Carrier plate 18 is generally rectangular in shape, having parallel mounting faces 20 and 22 and perpendicular edge faces 24, 26, 28, and 30 between mounting faces 20 and 22. Spaced-apart, flat, coplanar protrusions 32, 34, and 36 project from the remainder of edge face 24, and spaced-apart, flat, coplanar protrusions 38, 40, and 42 project from the remainder of edge face 28 at the separations of carrier plate 18 from the adjacent portions of assembly 10. Recesses or cutouts are formed in edge faces 24 and 28 between these protrusions by openings 12. Mounting face 20 is coated with square conductive layers 44, 46, 48, 50, 52, and 54, which extend to protrusions 32, 34, 36, 38, 40, and 42, respectively. Mounting face 22 is coated with an equal number of square conductive layers in registration with layers 44 through 54, two of which, namely, those in registration with layers 46 and 52, are designated 56 and 58, respectively. In the typical embodiment, each layer is 0.030" on a side. As illustrated, for layers 46 and 56 and layers 52 and 58 in FIG. 2B, the corresponding layers on mounting faces 20 and 22 are not electrically interconnected at this point in the process.

Reference is made to FIG. 3 for a description of the process for electrically interconnecting corresponding conductive layers on the mounting faces of the carrier plates. As depicted FIG. 3, a plurality of carrier plates, similar to that described in connection with FIG. 2, are stacked face-to-face so the respective protrusions of adjacent plates adjoin and are aligned with each other. The protrusions from the edge faces of the stacked carrier plates form coplanar surfaces 60, 62, and 64, to which a conductive layer is applied in a single operation to the exclusion of the remainder of the edge faces, namely, surfaces 66 and 68. Although the conductive layer could be applied to surfaces 60, 62, and 64 in different ways, the preferred technique is as follows. The same type of palladium-silver paste described above is worked into a thin, uniform layer on the surface of a rubber roller by rolling the paste with the roller on a glass surface until the desired thickness and uniformity are achieved. The roller is then rolled across surfaces 60, 62, and 64 concurrently in a single rolling motion, as indicated by the arrows in FIG. 3, to transfer the layer of palladium-silver paste thereto. Between layers 60, 62, and 64 the paste remains on the roller so that surfaces 66 and 68 are excluded from the transfer process. Then, the stack of carrier plates are put in an oven to bake at a temperature on the order of 300° until the silver-palladium paste hardens sufficiently to resist smudging upon contact. The stack of carrier plates is turned over to rest on the newly-coated protrusions, and the process is repeated for the three protrusions on the other edge of the stack of carrier plates. In the typical embodiment, the described layers of conductive material are between 0.003 and 0.005 inch thick.

After being processed in the manner described in connection with FIG. 3, the carrier plates each have six completely-formed wraparound terminal pads electrically interconnecting regions of their mounting faces. This is illustrated in FIG. 4 by the sectional view of carrier plate 18 showing conductive layers 70 and 72, which were formed in the manner described in connection with FIG. 3, extending completely between layers 46 and 56 and layer 52 and 58, respectively. At this point in the process, the carrier plates are fired at a high temperature, typically of the order of 850° C., for 8 to 10 minutes so as to completely harden the conductive layers forming the wraparound terminal pads. In accordance with common practice, the carrier plates could be held in Covar screen trays for this purpose.

In FIG. 5, a transformer comprising a ferromagnetic core 74, around which insulated windings 76 and 78 are wrapped, is secured to mounting face 20 of carrier plate 18 by epoxy or other bonding agent. Winding 76 has end tap leads 80 and 82 and a center tap lead 84, which are electrically connected, for example, by thermal compression bonding, to layers 44, 50, and 52, respectively. Similarly, winding 78 has end tap leads 86 and 88 and a center tap lead 90, which are electrically connected to layers 48, 54, and 46, respectively, for example, by thermal compression bonding. Thereafter, the transformer, including core, windings, and leads, and mounting face 20, including layers 44 through 54, are encapsulated in an epoxy potting compound or other other suitable electrical insulator to form a finished transformer as shown in FIG. 6.

In FIG. 6, the encapsulated transformer is designated 92, and two of the six wraparound terminal pads are designated 94 and 96. The transformer is mounted on a substrate 98, such as a hybrid circuit, having flat conductors, such as 100 and 102, which are electrically connected to respective wraparound terminal pads 94 and 96 by solder reflow techniques or a conductive epoxy laydown.

The described embodiment of the invention is only considered to be preferred and illustrative of the inventive concept. The scope of the invention is not to be restricted to such embodiment; various and numerous other arrangements may be devised skilled in the art without departing from the spirit and scope of the invention. For example, fewer or more than six wraparound terminal pads could be provided, depending upon the number of leads on the component mounted on the carrier plate.

What is claimed is:

1. A method for selectively coating with an electrical conductor a plurality of insulative carrier plates, each having a pair of flat mounting faces and a plurality of edge faces between the mounting faces, the edge faces including a plurality of spaced-apart, flat, coplanar protrusions projecting from remaining portions of the edge faces, the method comprising the steps of:
    forming a plurality of side-by-side rows of openings in a single large insulative carrier plate assembly;
    separating the single carrier plate assembly along straight lines through the respective rows of openings to form the plurality of carrier plates, the surfaces formed by the separations comprising the protrusions;
    selectively coating portions of one of the mounting faces of each plate with a plurality of mutually isolated first conductive layer areas in regions adjacent the protrusions, the first conductive layer areas extending to respective protrusions;
    selectively coating portions of the other mounting face of each plate with a plurality of mutually isolated second conductive layer areas in regions adjacent the protrusions, the second conductive layer areas extending to respective protrusions;
    stacking the plates mounting face-to-mounting face so respective protrusions of adjacent plates adjoin; and
    applying a conductive layer to the end faces of the adjoining protrusions of the stacked plates to the exclusion of remaining portions of the edge faces intermediate the protrusions so as to interconnect electrically respective first and second conductive layer areas associated with each protrusion.

2. The method of claim 1, in which the separating step comprises scoring the surface of the plate assembly along straight lines through the rows and bending the single plate to separate it along the score lines.

3. The method of claim 2, in which the applying step comprises working a hardenable conductive paste into a thin uniform layer on the surface of a roller, rolling the roller across the adjoining protrusions to transfer the layer of conductive paste thereto, and hardening the transferred layer.

4. The method of claim 1, in which the applying step comprises working a hardenable conductive paste into a thin uniform layer on the surface of a roller, rolling the roller across the adjoining protrusions to transfer the layer of conductive paste thereto, and hardening the transferred layer.

5. The method of claim 2, in which the steps of coating the mounting faces of each plate with a plurality of first and second conductive layers are performed before separating the carrier plate assembly.

6. The method of claim 5, in which the coating steps comprise applying a hardenable conductive paste to the mounting faces by silk screening and hardening the applied layers.

7. A method for manufacturing miniature transformers comprising the steps of:
    forming a plurality of side-by-side rows of openings in a single large insulative carrier plate assembly;
    separating the single carrier plate assembly along straight lines through the respective rows to form the plurality of carrier plates, the surfaces formed by the separations comprising the protrusions whereby each carrier plate has a pair of flat mounting faces and a plurality of edge faces between the mounting faces, the edge faces of each plate including a plurality of spaced-apart, coplanar first protrusions projecting from remaining portions of the edge faces and a plurality of spaced-apart flat, coplanar second protrusions projecting from remaining portions of the edge faces on the opposite side of the carrier plates from the first plurality of protrusions;
    selectively coating portions of one of the mounting faces of each plate with a plurality of mutually isolated first conductive layer areas in regions adjacent the first protrusions, the first conductive layer areas extending to respective first protrusions;
    selectively coating portions of the other mounting face of each plate with a plurality of mutually isolated second conductive layer areas in regions adjacent the first protrusions, the second conductive layer areas extending to respective first protrusions;
    selectively coating portions of one of the mounting faces of each plate with a plurality of mutually isolated third conductive layer areas in regions adjacent the second protrusions, the third conductive layer areas extending to respective second protrusions;
    selectively coating portions of the other mounting face of each plate with a plurality of mutually isolated fourth conductive layer areas in regions adjacent the second protrusions, the fourth conductive layer areas extending to respective second protrusions;
    stacking the plates mounting face-to-mounting-face so respective protrusions of adjacent plates adjoin;
    applying a conductive layer to the end faces of the adjoining protrusions of the stacked plates to the exclusion of remaining portions of the edge faces intermediate the protrusions so as to interconnect electrically respective first and second conductive layer areas associated with each protrusion and so as to interconnect electrically respective third and fourth conductive layer areas associated with each protrusion;
    mounting a transformer having at least first, second, third, and fourth leads on the one mounting face;
    electrically connecting the first and second leads, respectively, to individual first conductive layers;

electrically connecting the third and fourth leads, respectively, to individual third conductive layers; and encapsulating the transformer and the one mounting face in an insulative material.

8. The method of claim 7, in which the separating step comprises scoring the surface of the single plate along straight lines through the rows and bending the single plate to separate it along the score lines.

9. The method of claim 8, in which the applying step comprises working a hardenable conductive paste into a thin uniform layer on the surface of a roller, rolling the roller across the adjoining protrusions to transfer the layer of conductive paste thereto, and hardening the transferred layer.

10. The method of claim 7, in which the applying step comprises working a hardenable conductive paste into a thin uniform layer on the surface of a roller, rolling the roller across the adjoining protrusions to transfer the layer of conductive paste thereto, and hardening the transferred layer.

11. A method for selectively coating with an electrical conductor a plurality of insulative carrier plates, each having a pair of flat mounting faces and a plurality of edge faces between the mounting faces, the edge faces including a plurality of spaced-apart, flat coplanar protrusions projecting from remaining portions of the edge faces, the method comprising the steps of:

forming a plurality of parallel side-by-side rows of openings in a single large insulative carrier plate assembly to define the plurality of carrier plates;

coating one of the mounting faces of each plate with a plurality of mutually isolated first conductive layers, the first conductive layers extending to respective protrusions;

coating the other mounting face of each plate with a plurality of mutually isolated second conductive layers, the second conductive layers extending to respective protrusions;

separating the single carrier plate assembly along straight lines through the respective rows to form the plurality of carrier plates, the surfaces formed by the separations comprising the protrusions;

stacking the plates mounting face-to-mounting face so respective protrusions of adjacent plates adjoin; and applying a conductive layer to the end faces of the adjoining protrusions of the stacked plates to the exclusion of remaining portions of the edge faces, so as to interconnect electrically respective first and second conductive layers.

* * * * *